United States Patent [19]

Kubota

[11] Patent Number: 5,016,253

[45] Date of Patent: May 14, 1991

[54] SEMICONDUCTOR LASER DEVICE

[75] Inventor: Masayuki Kubota, Itami, Japan

[73] Assignee: Mitsubishi Denki Kabushiki Kaisha, Japan

[21] Appl. No.: 503,799

[22] Filed: Apr. 3, 1990

[30] Foreign Application Priority Data

Apr. 12, 1989 [JP] Japan ................... 1-93580

[51] Int. Cl.⁵ .............................................. H01S 3/19
[52] U.S. Cl. ...................................... 372/50; 372/43; 357/19
[58] Field of Search ................ 372/50, 43, 44; 357/19

[56] References Cited

U.S. PATENT DOCUMENTS 4,692,207  9/1987  Bouadma et al. ..................... 357/19
4,764,931  8/1988  Matsuda ................................ 372/50

FOREIGN PATENT DOCUMENTS 0075656   4/1984  Japan ..................... 357/19
61-152088  7/1986  Japan .
61-161785  7/1986  Japan .
62-4385    1/1987  Japan .
0158887   7/1988  Japan ..................... 372/43
63-164034  7/1988  Japan .
0228792   9/1988  Japan ..................... 372/43

Primary Examiner—Georgia Epps
Attorney, Agent, or Firm—Leydig, Voit & Mayer

[57] ABSTRACT

A semiconductor laser device includes at least two semiconductor laser elements emitting a plurality of laser beams from the front and rear facets, a light guide layer which guides the respective laser beams emitted from the rear facets and converts the wave fronts of the beams while guiding them to form separated beams, and a plurality of photodetectors which detect the converted wave fronts converted to monitor the intensities of laser beams emitted from the front facets.

10 Claims, 5 Drawing Sheets

SEMICONDUCTOR LASER DEVICE

FIELD OF THE INVENTION

The present invention relates to a semiconductor laser device which is used as a light source in an optical disk or a laser beam printer and, more particularly, to independently monitoring the laser light from a plurality of laser light emission regions.

BACKGROUND OF THE INVENTION

FIG. 5 shows a construction of a prior art semiconductor laser device using a two beam array semiconductor laser diode element. In FIG. 5, reference numeral 1 designates a two beam array semiconductor laser diode (hereinafter referred to as two beam array LD) having a pair of light emission regions. Reference numeral 2 designates a submount for mounting of the two beam array LD element 1. Reference numeral 3 designates a photodetector for detecting the light beams which are emitted from the rear facet of the two beam array LD element 1. Reference numeral 4 designates a stem for fixing the submount 2 and the photodetector 3. Reference characters A and B designate light beams which are emitted from the front facet of the two beam array LD element 1. Reference characters A' and B' designate light beams which are emitted from the rear facet of the two beam array LD element 1. These light beams A' and B' are emitted from the same cavity as light beam A and B.

The device will operate as follows.

When sufficient current flows in the two beam array LD element 1, light beams A and B are emitted from the front facet of the element and the light beams A' and B' are emitted from the rear facet thereof. Since the light beams A and A', and the light beams B and B' are emitted from the same cavity, respectively, the light intensities of the light beams A and A' and those of the light beams B and B' are in proportional relationship. Accordingly, the light intensities of the light beams A and B can be monitored by detecting the light intensities of the light beam A' and B', respectively, with the photodetector 3, which are emitted from the rear facet of the two beam array LD element 1.

Since there may be cases where the two beam array LD device should be used with making the two light emission portions emitting independently, the two beam array LD element 1 and the submount 2 are provided with a separation groove for electrically separating the two light emission portions. Further, the interval between the two light emission portions is set at about 100 to 200 microns.

The prior art semiconductor laser device is constructed in such a manner, and the two light beams A' and B' emitted from the rear facet of the two beam array LD element 1 have beams with angles of about 10° to 15° in the direction of straight line connecting the two light emission points whereby the light beams A' and B' are overlapped on the photodetector 3. Accordingly, although the two light emission portions are capable of independent light emission, it is impossible to independently monitor the light intensities of the light beams A' and B' with the photodetector 3. The photodetector is stereoscopically constructed using a stem to receive laser light beams sufficiently broadened in the longitudinal direction to enhance the detection efficiency of the photodetector. However, the above-described construction requires bonding of the laser element and the photodetector at 90° relative to each other, thereby complicating the fabrication process.

SUMMARY OF THE INVENTION

It is an object of the present invention to provide a semiconductor laser device independently monitoring the light intensities of the light beams emitted from more than two light emission regions that is simply produced.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to one aspect, of the present invention includes a semiconductor laser element including one or more semiconductor laser elements and emitting a plurality of laser beams from the front and rear facets of the resonator, a light guide layer which guides the plurality of laser light beams emitted from the front and rear facets and converts the wave fronts of the beams while guiding them, and a plurality of corresponding photodetectors which detect the converted wave front laser beams as monitors. Therefore, the light intensities of the light beams emitted from more than two light emission regions can be independently monitored.

DETAILED DESCRIPTION OF THE PREFERRED EMBODIMENT

An embodiment of the present invention will be described in detail with reference to the drawings.

Figure 1:
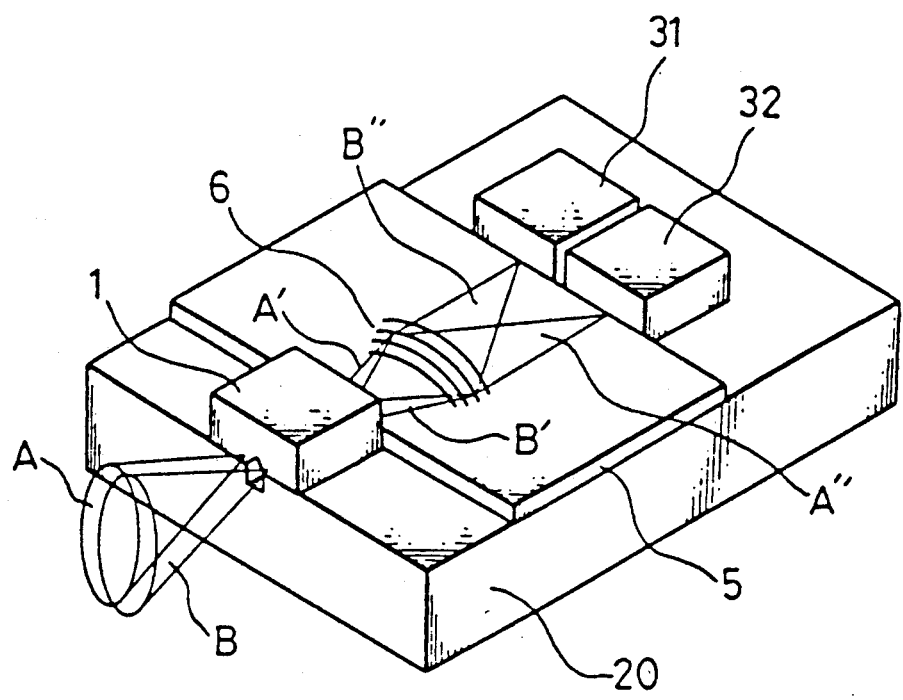
FIG. 1 is a diagram showing a construction of a semiconductor laser device utilizing a two beam laser array semiconductor laser element according to a first embodiment of the present invention.

FIG. 1 shows a construction of a semiconductor laser device according to a first embodiment of the present invention. In FIG. 1, reference numeral 20 designates an insulating substrate. A two beam array LD element 1 is mounted on the substrate 20. A light guide layer 5 is disposed on a surface of the substrate 20 on which the two beam array LD element 1 is mounted. A lens 6 is produced in the light guide layer 5. Photodetectors 31 and 32 are disposed on the surface of the substrate 20 and receive and detect the light beams A" and B" which are emitted from the rear facet of the two beam array LD element 1 and guided in the light guide layer 5. Reference characters A and B designate light beams emitted from the front facet of the two beam array LD element 1.

Figure 2:
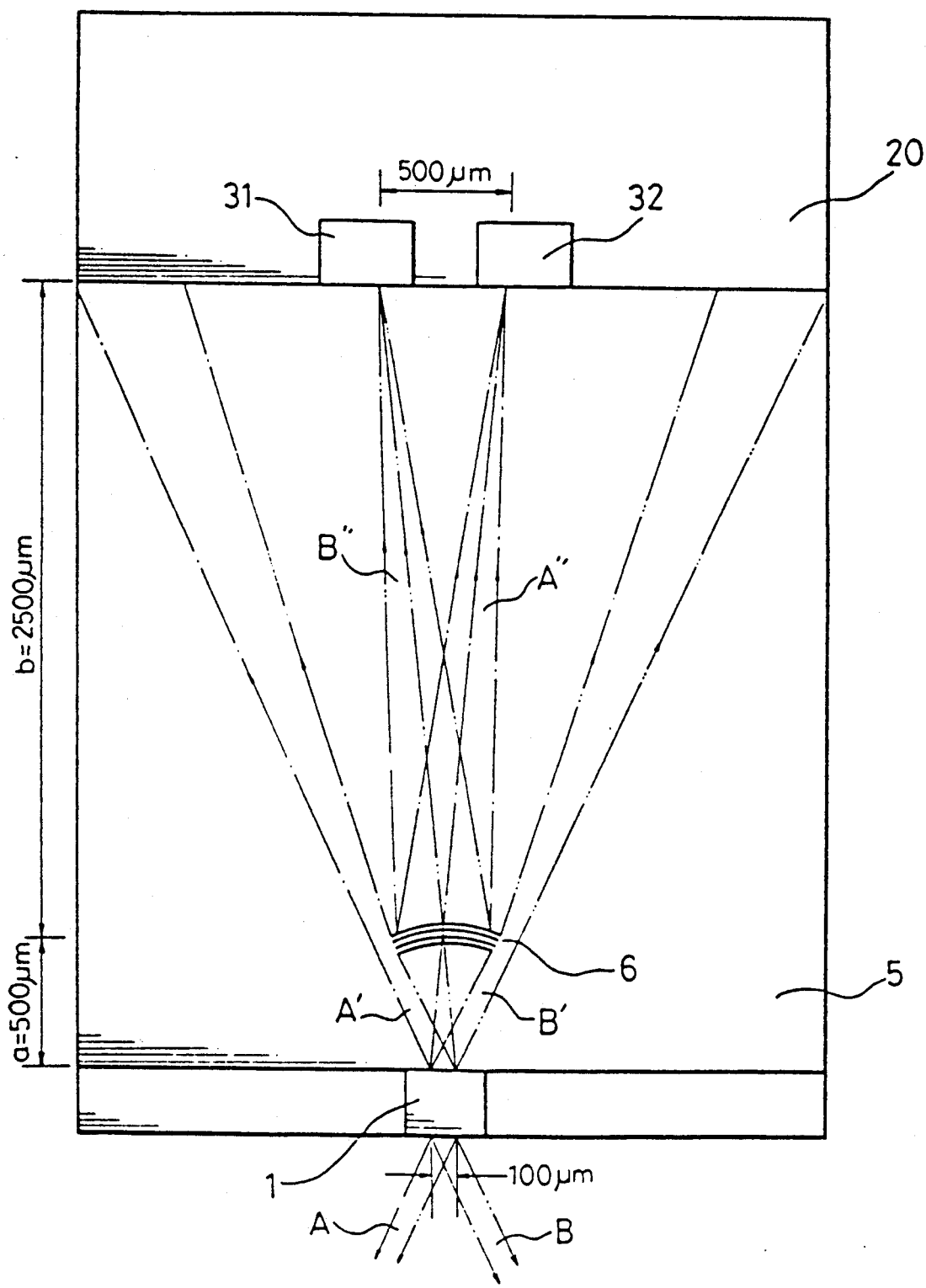
FIG. 2 is a diagram for explaining focusing of the emitted laser beams in the embodiment of FIG. 1.

FIG. 2 shows light paths associated with the light focusing of the emitted laser beams of the embodiment of FIG. 1.

The two beam array LD element 1 is mounted onto the substrate 20 as shown in FIG. 1, and a light guide layer 5 comprising a dielectric material such as LiNbO$_3$ into which Ti is diffused is produced of the neighborhood of the rear facet of the two beam array LD element 1 on the substrate 20 by a method such as sputtering. In this light guide layer 5, a lens 6 which converts the broadening light guided in the layer 5 to a focused light by wave front conversion is produced by a method such as proton exchange. The photodetectors 31 and 32 are fixed at positions where the guided light beams A" and B" are focused at the output side of the light guide layer 5.

The device will operate as follows.

By applying a current to the two beam array LD element 1, laser beams A and B are emitted from the front facet of the LD element 1 and the laser beams A' and B' are emitted from the rear facet corresponding to the laser beams A and B from the front facet, respectively. In the laser device, the photodetectors receive the rear facet emission light beams, detect the light outputs. The magnitude of the current applied to the laser element is controlled on the basis of the light outputs, thereby to control the light output from the front facet. In this embodiment, the laser beams A' and B' emitted from the rear facet of the LD element 1 are guided by the light guide layer 5. In this light guide layer 5, a lens 6, which functions as wave front conversion means, is produced as described above. The laser beams A' and B' are converted into focused light beams A" and B" from the broadening light beams by this lens 6. The focused light beams A" and B" are separately input to the photodetectors 32 and 31 which are provided at the rear end of the light guide layer 5.

FIG. 2 shows the manner of lightguiding the emitted laser beams in the light guide layer 5 together with examples of the sizes of the device.

In this embodiment, the light guide layer 5 for wave front conversion is provided, and the rear facet emission laser beams of the LD element 1 are guided to be input to the photodetectors 32 and 31, respectively. Therefore, the rear facet emission laser beams do not overlap on the photodetector as in the prior art device, and the light intensities of the light beams A" and B" are independently detected by the photodetectors 32 and 31, respectively, and the light intensities of the light beams A and B emitted from the front facet of the two beam array LD element 1 are thereby monitored.

In the construction of the prior art semiconductor laser device, since the photodetectors are fixed to the stem for efficient detection of the monitoring beams, wire bonding has to take place in different planes for the electrodes of the laser element and photodetectors. In this embodiment, however, since all the wire bonding can be made in one plane, the production process can be simplified to a great extent.

Figure 3A:
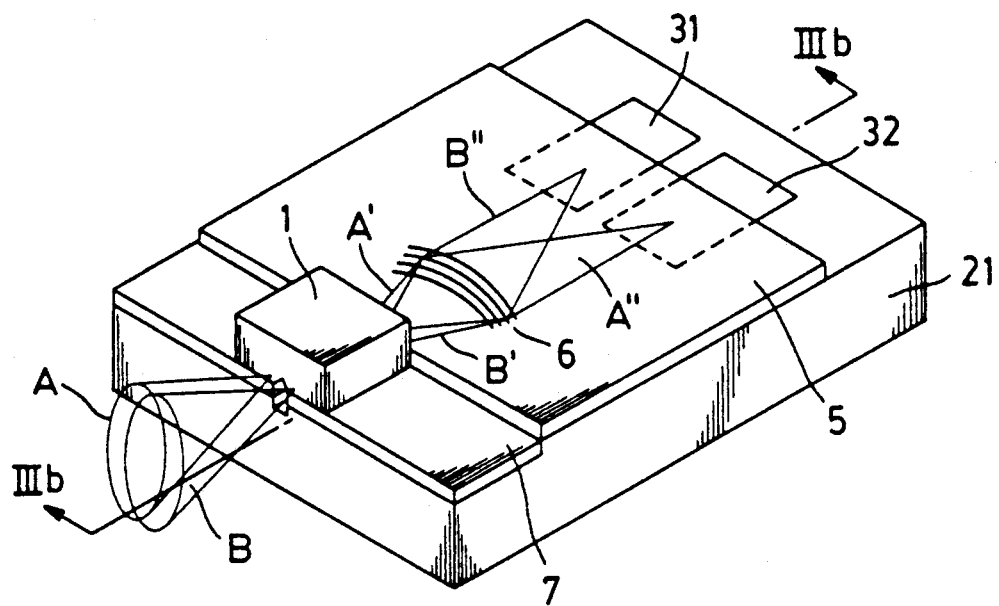
FIG. 3(a) is a perspective view showing the construction of a semiconductor laser device according to a second embodiment of the present invention.
Figure 3B:
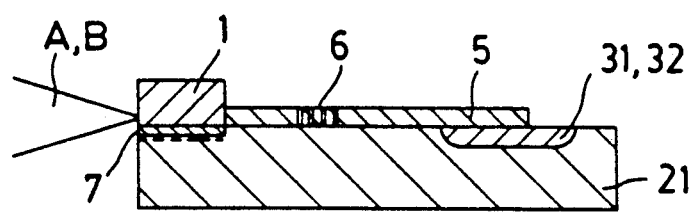
FIG. 3(b) is a cross-section of the device of FIG. 3(a)

FIGS. 3(a) and 3(b) show a semiconductor laser device according to a second embodiment of the present invention. FIG. 3(a) shows a perspective view, and FIG. 3(b) shows a cross-sectional view in the IIIb—IIIb line in FIG. 3(a).

In these figures, the same reference numerals as those in FIG. 1 designate the same or corresponding elements. Reference numeral 21 designates a silicon substrate, and reference numeral 7 designates an insulating layer.

In this second embodiment, an n type silicon substrate is used for the substrate 21, and p type impurities are introduced to the regions where photodetectors are to be produced by diffusion. Those regions are used as photodetectors 31 and 32. Thereafter, the light guide layer 5 and the lens are produced by a similar method as in the first embodiment. On the other hand, in order to independently operate the respective light emission regions of the two beam array LD element 1, an insulating layer 7 is disposed where the two beam array LD element 1 are mounted to electrically separate the element 1 from the silicon substrate. Silicon oxide or the like may be used for this insulating layer 7. Herein, this layer 7 may be p type semiconductor layer and insulated by a p-n junction from the substrate considering the directions of the laser driving current and the bias current. Thereafter, a two beam array LD element 1 is mounted onto the insulating layer 7.

The device will operate as follows.

In the semiconductor laser device constructed in such a manner, the light beams A' and B' introduced to the light guide layer 5 are separated and focused by the lens 6 to light beams A" and B", and the light beams A" and B" impinge on to the photodetectors 32 and 31. The light intensities of the light beams A" and B" are detected by the photodetectors 32 and 31, respectively, and similarly as in the first embodiment, the light outputs of the light bundles A and B emitted from the front facet of the two beam array LD element 1 are monitored. Furthermore, in this embodiment, since the photodetectors 31 and 32 are fabricated on a substrate, the fabrication process is simpler.

Figure 4:
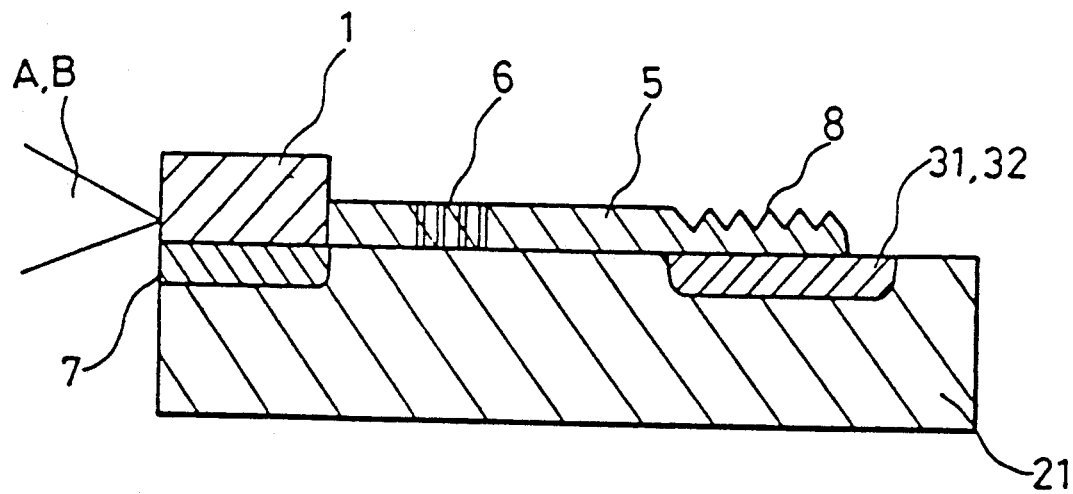
FIG. 4 is a cross-section of a semiconductor laser device according to third embodiment of the present invention.
Figure 5:
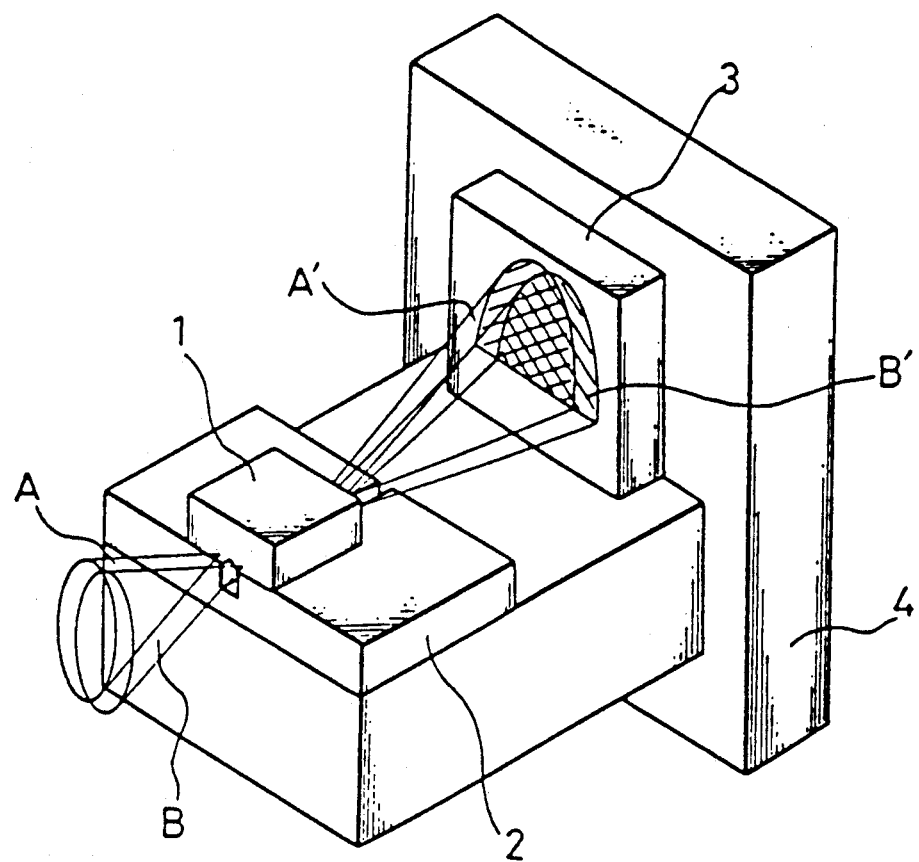
FIG. 5 is a perspective view of a prior art two beam array semiconductor laser device.

FIG. 4 shows a cross-sectional view of a semiconductor laser device according to a third embodiment of the present invention. In FIG. 4, the same reference numerals as those of FIG. 3(b) designate the same or corresponding elements, and reference numeral 8 designates a grating produced on the light guide layer 5 opposite the photodetectors 31 and 32.

In this third embodiment, the light outputs of the light beams A and B emitted from the front facet of the two beam laser array LD element 1 are monitored in the same operation as that of the second embodiment. In the above-described second embodiment, the coupling efficiency between the light beams A" and B" and the photodetectors 32 and 31 is low. In this third embodiment, by providing a grating 8 as shown in FIG. 4, the light beams A" and B" are diffracted toward the light photodetectors 32 and 31. Therefore, the light coupling efficiency between the photodetectors 32 and 31 and the light beams A" and B" is enhanced, improving characteristics.

While in the above-illustrated embodiment a semiconductor laser device using a two beam array LD element is described, the laser device may have three or more light emission regions. Further, if the light emission regions may be produced sufficiently close to each other, the laser device may be a multi-point emission type using a plurality of independent laser elements, not a monolithic element.

As is evident from the foregoing description, according to the present invention, a semiconductor laser element having a plurality of emission portions, a plurality of photodetectors, and a light guide layer having a wave front conversion means are provided on a substrate. Light beams which are emitted from the semiconductor laser element and guided by the light guide layer are made incident to the photodetector. Therefore, the light intensities of the light beams emitted from the plurality of light emission regions can be independently monitored. Furthermore, since the whole device is planar, the production process is simplified.

What is claimed is:

1. A semiconductor laser device comprising:
   a semiconductor laser element including opposed front and rear facets for emitting a plurality of laser beams from each of said front and rear facets;
   a light guide layer for guiding the plurality of laser beams emitted from said rear facet and for converging the laser beams by wave front conversion during guiding; and
   a plurality of photodetectors which each detect a respective wave front converged laser beam from said light guide layer for monitoring the laser beams emitted from said front facet.

2. A semiconductor laser device as claimed in claim 1 comprising:
   an insulating substrate on which said semiconductor laser element, said plurality of photodetectors, and said light guide layer are disposed, said light guide layer being disposed adjacent said rear facet of said semiconductor laser element and said plurality of photodetectors being disposed on the opposite side of said light guide layer from said semiconductor laser element.

3. A semiconductor laser device as defined in claim 2 wherein said lightguide layer comprises $LiNbO_3$ into which Ti has been diffused.

4. A semiconductor laser device as defined in claim 2 wherein said substrate is Si and said photodetectors are integral with said Si substrate.

5. A semiconductor laser device as defined in claim 4 wherein said photodetectors diffusion regions in said Si substrate.

6. A semiconductor laser device as claimed in claim 5 wherein said Si substrate is n type and said diffused regions contain at least one of B, Zn, and Ga as a dopant impurity.

7. A semiconductor laser device as defined in claim 5 wherein said light guide layer covers said photodetectors.

8. A semiconductor laser device as claimed in claim 7 wherein said light guide layer includes a diffraction grating to increase the photocoupling efficiency between the laser beams guided by said light guide layer and said photodetectors.

9. A semiconductor laser device as claimed in claim 1 wherein said laser element includes a plurality of discrete semiconductor lasers.

10. A semiconductor laser device as claimed in claim 1 wherein said laser element includes an integrated semiconductor laser including multiple resonators for producing the plurality of laser beams.

* * * * *